(12) United States Patent
Fang

(10) Patent No.: US 10,670,645 B2
(45) Date of Patent: Jun. 2, 2020

(54) ELECTRIC FIELD COMPONENT DETECTION DEVICE AND METHOD, AND SPACE ELECTRIC FIELD DETECTION SYSTEM

(71) Applicant: BOE TECHNOLOGY GROUP CO., LTD., Beijing (CN)

(72) Inventor: Yigeng Fang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 73 days.

(21) Appl. No.: 15/975,358

(22) Filed: May 9, 2018

(65) Prior Publication Data
US 2019/0113557 A1 Apr. 18, 2019

(30) Foreign Application Priority Data
Oct. 18, 2017 (CN) .................. 2017 2 1340467 U

(51) Int. Cl.
*G01R 29/12* (2006.01)
*G01R 29/08* (2006.01)

(52) U.S. Cl.
CPC ......... *G01R 29/12* (2013.01); *G01R 29/0878* (2013.01)

(58) Field of Classification Search
None
See application file for complete search history.

(56) References Cited

U.S. PATENT DOCUMENTS

2006/0279271 A1* 12/2006 Xia ................. G01R 29/0878
324/71.1

FOREIGN PATENT DOCUMENTS

| CN | 101246192 A | 8/2008 |
| CN | 105911370 A | 8/2016 |

* cited by examiner

*Primary Examiner* — Jas A Sanghera
(74) *Attorney, Agent, or Firm* — Foley & Lardner LLP

(57) ABSTRACT

The present disclosure provides an electric field component detection device and method, and a space electric field detection system. The electric field component detection device comprises a first electric field sensor and a second electric field sensor arranged symmetrically with respect to a driving rod; a differentiator, configured to perform differential processing on induced currents generated by the first electric field sensor and the second electric field sensor, respectively; a first support member and a second support member disposed at two ends of the driving rod, respectively, wherein each support member includes a bracket and an elastic portion disposed on the bracket, one end of the driving rod is connected with the elastic portion of the first support member, and the other end of the driving rod is connected with the elastic portion of the second support member.

20 Claims, 7 Drawing Sheets

ELECTRIC FIELD COMPONENT DETECTION DEVICE AND METHOD, AND SPACE ELECTRIC FIELD DETECTION SYSTEM

CROSS-REFERENCE TO RELATED APPLICATIONS

The present application claims priority to China Patent Application No. 201721340467.6 filed on Oct. 18, 2017, the disclosure of which is incorporated by reference herein in its entirety.

TECHNICAL FIELD

The present disclosure relates to an electric field component detection device and method, and a space electric field detection system.

BACKGROUND

At present, in the related art of detecting an electric field component by an electric field sensor, a driving rod, when in periodic movement, may be collided with support members which are arranged at two ends of the driving rod, which would lead to the rupture of the driving rod.

SUMMARY

Some embodiments of the present disclosure provide an electric field component detection device comprising: a first electric field sensor and a second electric field sensor arranged symmetrically with respect to a driving rod, wherein in each electric field sensor, a shielding electrode is grounded and arranged vertically on the driving rod, the shielding electrode being configured to be driven by the driving rod to move periodically in an extending direction of the driving rod, and a sensing electrode is arranged in parallel with the shielding electrode; a differentiator, electrically connected to the sensing electrode of the first electric field sensor and the sensing electrode of the second electric field sensor, respectively, and configured to perform differential processing on induced currents generated by the first electric field sensor and the second electric field sensor, respectively, to obtain a component of a space electric field in an extending direction of the shielding electrode; a first support member and a second support member, disposed at two ends of the driving rod, respectively, wherein each support member includes a bracket and an elastic portion disposed on the bracket, one end of the driving rod is connected with the elastic portion of the first support member, and the other end of the driving rod is connected with the elastic portion of the second support member.

Some embodiments of the present disclosure also provide a space electric field detection system, comprising: at least one electric field component detection device, each electric field component detection device comprising: a first electric field sensor and a second electric field sensor arranged symmetrically with respect to a driving rod, wherein in each electric field sensor, a shielding electrode is grounded and arranged vertically on the driving rod, the shielding electrode being configured to be driven by the driving rod to move periodically in an extending direction of the driving rod, and a sensing electrode is arranged in parallel with the shielding electrode; a differentiator, electrically connected to the sensing electrode of the first electric field sensor and the sensing electrode of the second electric field sensor, respectively, and configured to perform differential processing on induced currents generated by the first electric field sensor and the second electric field sensor, respectively, to obtain a component of a space electric field in an extending direction of the shielding electrode; a first support member and a second support member, disposed at two ends of the driving rod, respectively, wherein each support member includes a bracket and an elastic portion disposed on the bracket, one end of the driving rod is connected with the elastic portion of the first support member, and the other end of the driving rod is connected with the elastic portion of the second support member; and a space electric field synthesizing device, electrically connected to said electric field component detection device, configured to determine a magnitude of the space electric field based on a detection result of said electric field component detection device.

Some embodiments of the present disclosure also provide an electric field component detection method comprising: controlling a driving rod to move periodically, so as to drive shielding electrodes of a first electric field sensor and a second electric field sensor to move periodically in an extending direction of a driving rod, wherein the first electric field sensor and the second electric field sensor are arranged symmetrically with respect to the driving rod, in each electric field sensor, the shielding electrode is grounded and arranged vertically on the driving rod, a sensing electrode is arranged in parallel with the shielding electrode, and elastic portions disposed on two ends of the driving rod provide elastic protection to the driving rod; performing differential processing on induced currents generated by the first electric field sensor and the second electric field sensor, respectively, to obtain a component of a space electric field in an extending direction of the shielding electrode.

Figure 1:
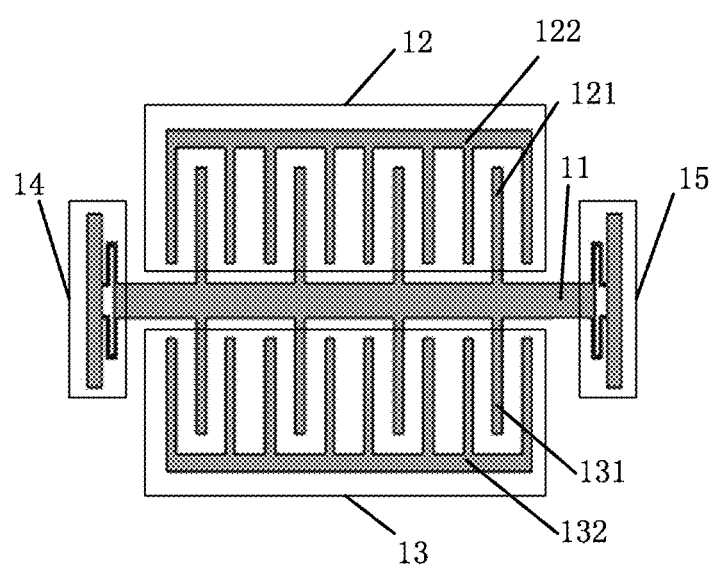
FIG. 1 is a schematic diagram of an electric field component detection device according to some embodiments of the present disclosure.

It should be understood that the dimensions of the various parts shown in the drawings are not drawn according to the actual proportional relationship. In addition, the same or similar reference signs denote the same or similar components.

DETAILED DESCRIPTION

The exemplary embodiments of the present disclosure will now be described in detail with reference to the accompanying drawings. The description of the exemplary embodiments is intended to be merely illustrative, and is not meant to be limitation on the present disclosure and its application or use in any way. The present disclosure may be implemented in many different forms, not limited to the embodiments described herein. These embodiments are provided so that this disclosure will be thorough and complete, and will fully convey the scope of the disclosure to the person skilled in the art. It should be noted that, unless otherwise specified, relative arrangement of components and steps, ingredients of the materials, numerical expressions and numerical values set forth in these embodiments are to be construed as merely illustrative, not as a limitation.

The terms "first", "second" and similar words used in the present disclosure do not denote any order, quantity, or importance, but merely serve to distinguish different parts. Similar words like "include" or "comprise" mean that the element that precedes the word covers the elements listed after that term, but does not exclude the possibility of also covering other elements. "Up", "Down", "Left", "Right", and the like are used only to indicate a relative positional relationship, and when the absolute position of the described object is changed, the relative positional relationship may also change correspondingly.

In the present disclosure, when it is described that a specific component is located between a first component and a second component, an intervening component may exist between the specific component and the first or second component, or there may be no intervening component. When it is described that a specific component is connected to other components, the specific component may be directly connected with the other components without having an intervening component therebetween, or may not be directly connected with the other components but have an intervening component therebetween.

Unless otherwise specifically defined, all terms (including technical terms or scientific terms) used in the present disclosure have the same meanings as understood by one of ordinary skill in the art to which the present disclosure belong. It will also be understood that terms defined in, for example, common dictionaries should be interpreted as having meanings that are consistent with their meanings in the context of the relevant art, and should not be interpreted in an idealized or extremely formal sense unless expressly defined here.

Techniques, methods, and devices known to one of ordinary skill in the relevant art may not be discussed in detail but, where appropriate, such techniques, methods, and devices are to be considered part of the description.

FIG. 1 is a schematic diagram of an electric field component detection device according to some embodiments of the present disclosure. As shown in FIG. 1, the electric field component detection device includes a driving rod 11, a first electric field sensor 12, a second electric field sensor 13, a first support member 14, a second support member 15 and a differentiator 16 (shown in FIG. 3).

As shown in FIG. 1, the first electric field sensor 12 and the second electric field sensor 13 are disposed symmetrically with respect to the driving rod 11. In each electric field sensor, a shielding electrode is grounded and disposed vertically on the driving rod, and a sensing electrode is disposed in parallel with the shielding electrode. For example, the shielding electrode is mounted directly on the driving rod, or the shielding electrode is mounted on the driving rod by means of a connecting part, to realize rigid connection of the shielding electrode and the driving rod.

In some embodiments, in the first electric field sensor 12, the shielding electrode 121 is grounded and disposed vertically on the driving rod 11, and the sensing electrode 122 is disposed in parallel with the shield electrode 121. In the second electric field sensor 13, the shielding electrode 131 is grounded and arranged vertically on the driving rod 11, and the sensing electrode 132 is arranged in parallel with the shielding electrode 131. The shielding electrode 121 and the shielding electrode 131 move periodically by the driving of the driving rod 11 in the extending direction of the driving rod (by taking FIG. 1 as an example, the extending direction of the driving rod is a horizontal direction). Induced charges changed periodically are generated on the sensing electrode 122 and the sensing electrode 132, thereby induced currents are produced.

Figure 2A:
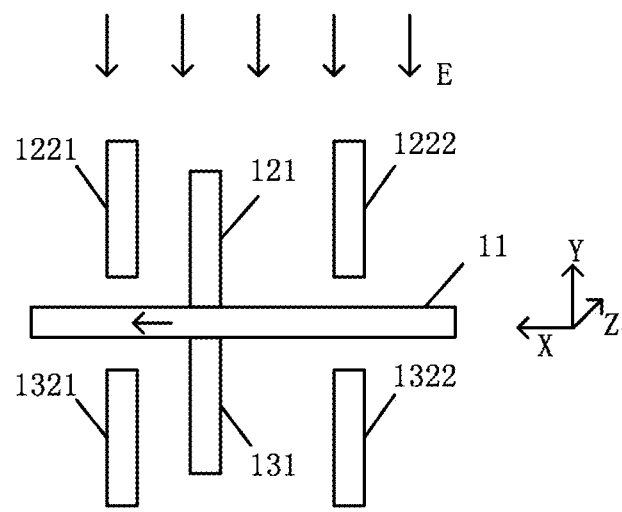
FIGS. 2a and 2b are schematic diagrams of a periodic movement of a driving rod according to some embodiments of the present disclosure.
Figure 2B:
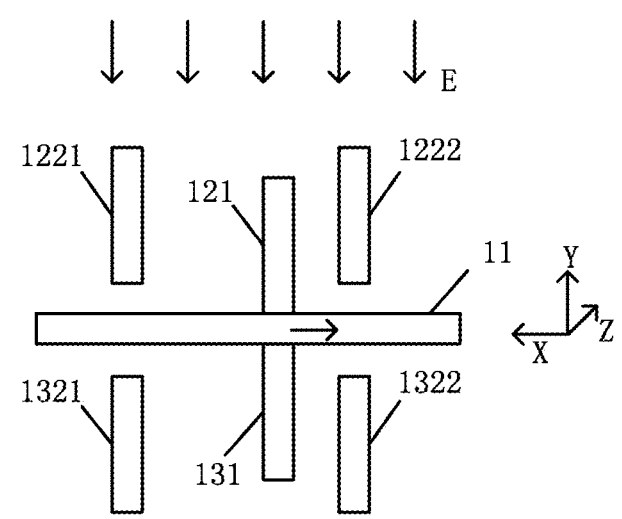

In some embodiments, the driving rod 11 moves periodically in the manner as shown in FIG. 2a and FIG. 2b, so that the induced currents are generated in the sensing electrodes of the first electric field sensor 12 and the second electric field sensor 13. A direction of the induced currents are in the extending direction of the shielding electrodes.

FIGS. 2a and 2b are schematic diagrams of a periodic movement of a driving rod according to some embodiments of the present disclosure.

As shown in FIG. 2a, a direction of an electric field E to be measured coincides with the extending direction of the shielding electrode 121 and the shielding electrode 131. When the driving rod 11 moves to the left, in the first electric field sensor 12, the shielding electrode 121 moves away from the sensing electrode 1222 while approaching the sensing electrode 1221. In the second electric field sensor 13, the shielding electrode 131 moves away from the sensing electrode 1322 while approaching the sensing electrode 1321.

In this process, the shielding effect of the shielding electrode 121 on the sensing electrode 1221 is enhanced, and the shielding effect of the shielding electrode 121 on the sensing electrode 1222 is weakened. Meanwhile, the shielding effect of the shielding electrode 131 on the sensing electrode 1321 is enhanced, and the shielding effect of the shielding electrode 131 on the sensing electrode 1322 is weakened. Accordingly, the induced charges generated by the sensing electrode 1221 and the sensing electrode 1321 under the action of the electric field E decrease, and the induced charges generated by the sensing electrode 1222 and the sensing electrode 1322 under the action of the electric field E increase.

As shown in FIG. 2b, when the driving rod 11 moves to the right, in the first electric field sensor 12, the shielding electrode 121 moves away from the sensing electrode 1221 while approaching the sensing electrode 1222. In the second electric field sensor 13, the shielding electrode 131 moves away from the sensing electrode 1321 while approaching the sensing electrode 1322.

In this process, the shielding effect of the shielding electrode 121 on the sensing electrode 1222 is enhanced, and the shielding effect of the shielding electrode 121 on the sensing electrode 1221 is weakened. Meanwhile, the shielding effect of the shielding electrode 131 on the sensing electrode 1322 is enhanced, and the shielding effect of the shielding electrode 131 on the sensing electrode 1321 is weakened. Accordingly, the induced charges generated by the sensing electrode 1221 and the sensing electrode 1321 under the action of the electric field E increase, and the induced charges generated by the sensing electrode 1222 and the sensing electrode 1322 under the action of the electric field E decrease.

As can be seen from FIGS. 2*a* and 2*b*, with the periodic movement of the driving rod 11, induced charges changed periodically are generated in the sensing electrodes 1221 and 1222 of the first electric field sensor 12, and the sensing electrodes 1321 and 1322 of the second electric field sensor 13, thereby induced currents are produced.

For the sake of simplicity, in FIGS. 2*a* and 2*b*, only one shield electrode is shown in each electric field sensor. In fact, a plurality of shielding electrodes and corresponding sensing electrodes can be provided in each electric field sensor as required. For example, in the embodiment shown in FIG. 1, the case where a plurality of shielding electrodes and corresponding sensing electrodes are provided in each electric field sensor is given.

It should be noted that, in the related art that uses electric field sensors to detect electric field components, usually only one electric field sensor is provided. As the space electric field has components in different directions, the sensing electrodes will generate induced charges changed periodically in different directions correspondingly.

For example, in the XYZ coordinate system, the user measures the magnitude of the component of the electric field in the Y direction by using the electric field sensor. However, since the space electric field may have components in the X direction, the Y direction, and the Z direction, induced charges changed periodically are generated in all of the X direction, the Y direction, and the Z direction by the sensing electrode, which cause interference to the electric field measurement in the Y direction. In order to overcome this defect, the related art requires more complicated calculation processing to eliminate the interference caused by the components of the electric field in other directions. However, this manner of calculation is rather complicated, and the effect is not satisfactory.

In the electric field component detection device provided by the present disclosure, the first electric field sensor 12 and the second electric field sensor 13 are disposed symmetrically with respect to the driving rod 11. This symmetrical structure, during measurement of the electric field component in the specified direction, can eliminate the interference caused by the electric field components in other directions effectively.

Figure 3:
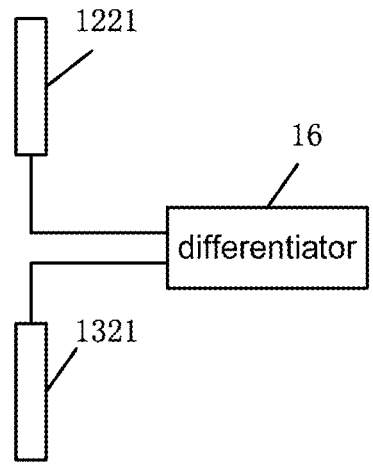
FIG. 3 is a schematic diagram of an electric field component detection device according to some other embodiments of the present disclosure.

For example, as shown in FIGS. 2*a* and 2*b*, in the XYZ coordinate system, the driving rod 11 moves periodically in the X direction. The electric field E is a component of the space electric field in the Y direction, and the Z direction is perpendicular to the XY plane. Since the first electric field sensor 12 and the second electric field sensor 13 are disposed symmetrically with respect to the driving rod 11, in this case, the components of the space electric field in the X direction and the Z direction have the same influence on the sensing electrodes in the first electric field sensor 12 and the second electric field sensor 13. In other words, the sensing electrodes of the first electric field sensor 12 and the second electric field sensor 13 generate the same induced charges in the X direction and the Z direction, and only the induced charges generated in the Y direction are different from each other. This is due to that a distance between the sensing electrodes 1221 and 1222 in the first electric field sensor 12 to the field source, and a distance between the sensing electrodes 1321 and 1322 in the second electric field sensor 13 to the field source in the Y direction are different. Therefore, by performing differential processing on the induced currents generated by the sensing electrodes in the first electric field sensor 12 and the second electric field sensor 13, the electric field component in the Y direction can be obtained accurately FIG. 3 is a schematic diagram of an electric field component detection device according to some other embodiments of the present disclosure. As shown in FIG. 3, the electric field component detection device further includes a differentiator 16, electrically connected to the sensing electrode 122 of the first electric field sensor 12 and the sensing electrode 132 of the second electric field sensor 13. The differentiator 16 performs differential processing on the induced currents generated by the sensing electrode 122 and the sensing electrode 132, respectively, to obtain a component of the space electric field in the extending direction of the shielding electrode.

In some embodiments, the differentiator 16 is a differential amplifying circuit composed of transistors.

For example, during measurement of the electric field component in the Y direction, for the sensing electrode 1221, suppose the induced charges in the X direction are $Q1x$, the induced charges in the Y direction are $Q1y$, and the induced charges in the Z direction are $Q1z$. For the sensing electrode 1321, suppose the induced charges in the X direction are $Q2x$, the induced charges in the Y direction are $Q2y$, and the induced charges in the Z direction are $Q2z$. Since the first electric field sensor 12 and the second electric field sensor 13 are disposed symmetrically with respect to the driving rod 11, the induced charges $Q1x$ are the same as the induced charges $Q2x$, and the induced charges $Q1z$ are the same as the induced charges $Q2z$.

In some embodiments, differential processing is performed on the induced currents generated by the sensing electrode 1221 and the sensing electrode 1321, to obtain output current $I_{output}$. That is, $$I_{output}=d(Q1x+Q1y+Q1z-Q2x-Q2y-Q2z)/dt$$

Since $Q1z=Q2z$, $Q1x=Q2x$, the above formula can be simplified as follows, $$I_{output}=d(Q1y-Q2y)/dt$$

Thus, while the electric field component in the Y direction is obtained by using the induced current, the interference of the components in the X direction and the Z direction of the electric field can also be eliminated effectively.

It should be noted that, in the above embodiments, one electrode of the first electric field sensor 12 and one electrode of the second electric field sensor 13 are used for measuring the electric field component. However, in some embodiments, multiple sensing electrodes which generate induced currents of the same phase in the same electric field sensor can be connected in series to obtain a larger current. The larger currents generated by the first electric field sensor 12 and the second electric field sensor 13 are used for differential processing, so as to improve the accuracy of measurement.

It should also be noted, the present disclosure has been described above by taking the measurement of the electric field component in the Y direction as an example. However, it is also possible to measure the electric field components in the X direction or the Z direction as needed, as long as the extending direction of the shielding electrode is set to be consistent with the measured direction.

Returning to FIG. 1, a first support member 14 and a second support member 15 are provided on the two sides of the driving rod 11, respectively. The schematic structural diagram of the first support member 14 and the second support member 15 is shown in FIG. 4.

Figure 4:
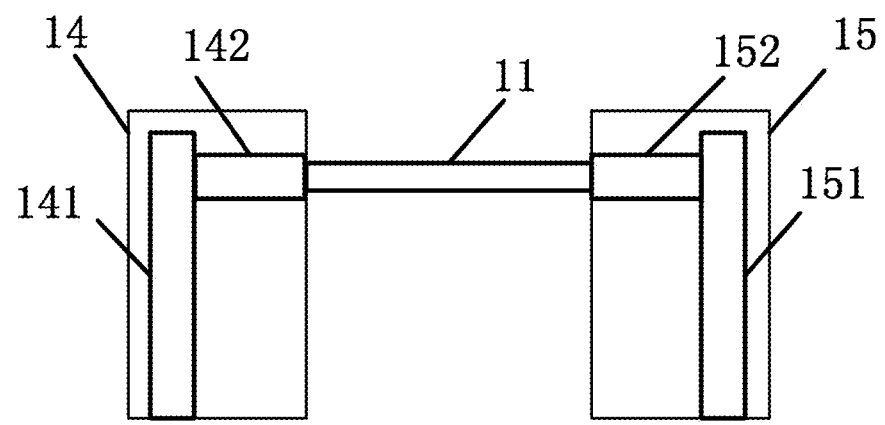
FIG. 4 is a schematic diagram of support members of a driving rod according to some embodiments of the present disclosure.

FIG. 4 is a schematic diagram of support members of a driving rod according to some embodiments of the present disclosure. As shown in FIG. 4, the first support member 14 includes a bracket 141 and an elastic portion 142 disposed on the bracket 141. The second support member 15 includes a bracket 151 and an elastic portion 152 disposed on the bracket 151. One end of the driving rod 11 is connected to the elastic portion 142 of the first support member 14, and the other end of the driving rod 11 is connected to the elastic portion 152 of the second support member 15. Since the elastic portions 142 and 152 have certain elasticity, the elastic portions 142 and 152 can provide cushion protection for the driving rod 11 when the driving rod 11 moves periodically.

Figure 5A:
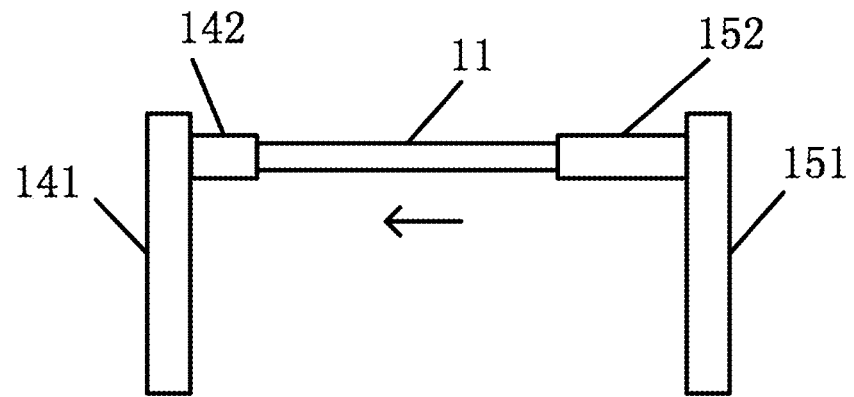
FIGS. 5a and 5b are schematic diagrams of a periodic movement of support members of a driving rod along with the driving rod according to some embodiments of the present disclosure.
Figure 5B:
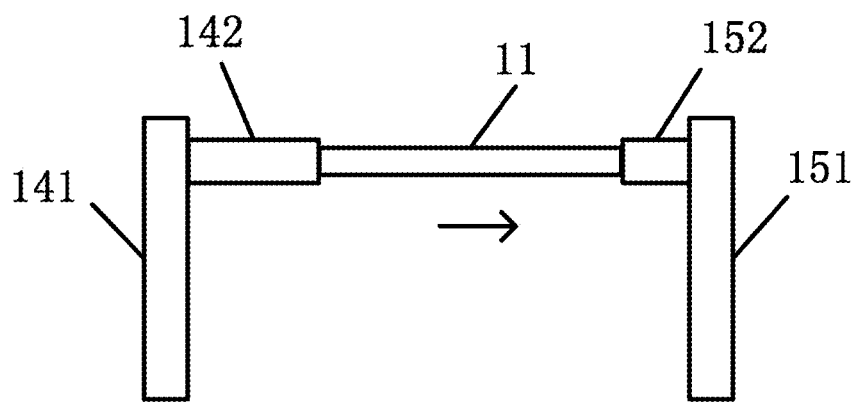

FIGS. 5a and 5b are schematic diagrams of a periodic movement of support members of a driving rod along with the driving rod according to some embodiments of the present disclosure.

In some embodiments, as shown in FIG. 5a, when the driving rod 11 moves leftward, the elastic portion 142 is deformed by being pressed by the driving rod 11, and the elastic portion 152 is also deformed by being pulled by the driving rod 11. Therefore, when the driving rod 11 moves leftward, the elastic portion 142 will provide cushion protection for the driving rod 11 due to the pressing deformation, and the elastic portion 152 will also provide the driving rod 11 with a pulling force opposite to its moving direction due to the pulling deformation, so as to prevent the driving rod 11 from colliding with the bracket 141.

As shown in FIG. 5b, when the driving rod 11 moves to the right, the elastic portion 152 is deformed by being pressed by the driving rod 11, and the elastic portion 142 is also deformed by being pulled by the driving rod 11. Therefore, when the driving rod 11 moves to the right, the elastic portion 152 will provide cushion protection for the driving rod 11 due to the pressing deformation, and the elastic portion 142 will also provide the driving rod 11 with a pulling force opposite to its moving direction due to the pulling deformation, so as to prevent the driving rod 11 from colliding with the bracket 151.

In the above embodiment, during the periodic movement of the driving rod 11, the elastic portions 142 and 152 disposed on the ends of the driving rod 11 provide cushion protection for the driving rod 11, so as to prevent the driving rod 11 from being ruptured because of colliding with the brackets effectively.

In some embodiments, the elastic portions 142 and 152 are springs or other elastic portions that may deform elastically.

In some embodiments, the elastic portions 142 and 152 extend and retract in an extending direction of the driving rod 11, to provide better cushion protection for the driving rod 11.

Figure 6:
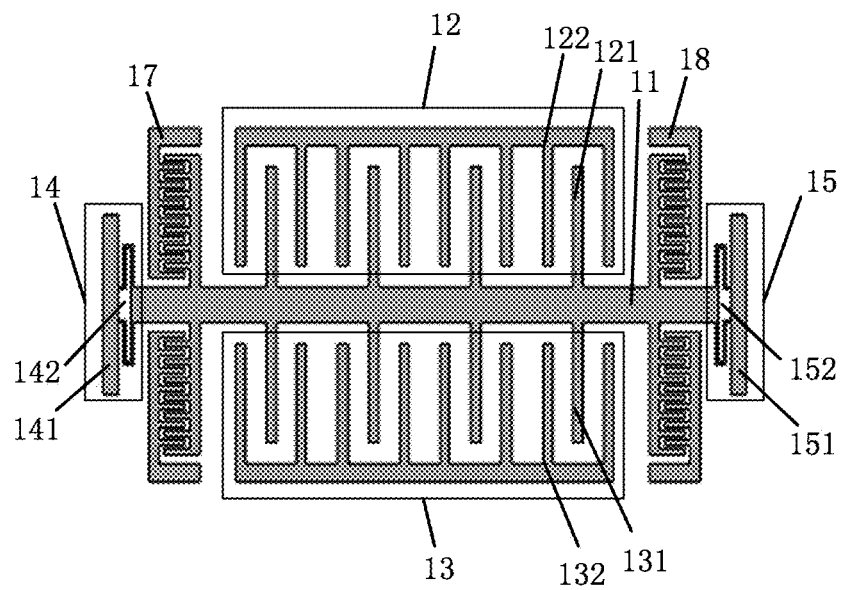
FIG. 6 is a schematic diagram of an electric field component detection device according to some other embodiments of the present disclosure.

FIG. 6 is a schematic diagram of an electric field component detection device according to some other embodiments of the present disclosure. As shown in FIG. 6, the electric field component detection device further includes driving mechanisms 17 and 18 in drive connection with the driving rod 11. The drive mechanisms 17 and 18 are configured to drive the driving rod 11 to move periodically.

In some embodiments, the drive mechanisms 17 and 18 are electrostatic comb drives. Of course, the driving mechanism is not limited to that, and other driving means capable of driving the driving rod to perform periodic movement may also be adopted.

Figure 7:
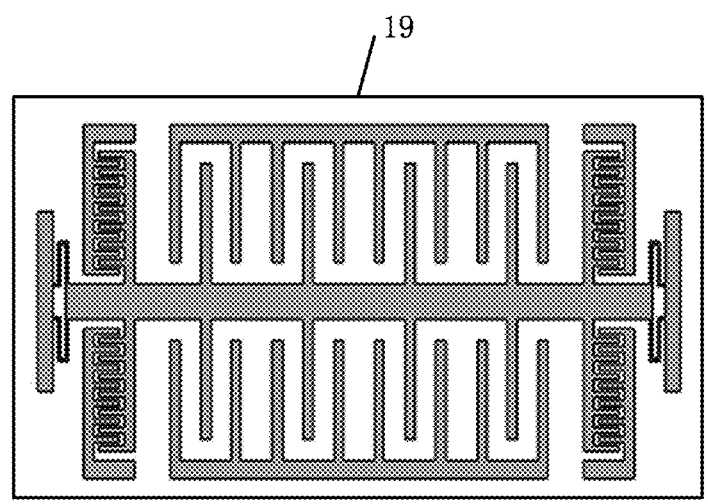
FIG. 7 is a schematic diagram of an electric field component detection device according to some other embodiments of the present disclosure.

FIG. 7 is a schematic diagram of an electric field component detection device according to some other embodiments of the present disclosure. As shown in FIG. 7, the electric field component detection device further includes a support plate 19, which provides support for the sensing electrodes in the first electric field sensor 12 and the second electric field sensor 13, as well as the first support member 14 and the second support member 15.

In some embodiments, the sensing electrodes in the first electric field sensor 12 and the second electric field sensor 13, as well as the first support member 14 and the second support member 15 are mounted on the support plate 19.

Thus, by adjusting the support plate 19, it is convenient for the electric field component detection device to detect the electric field component in a specified direction.

Figure 8:
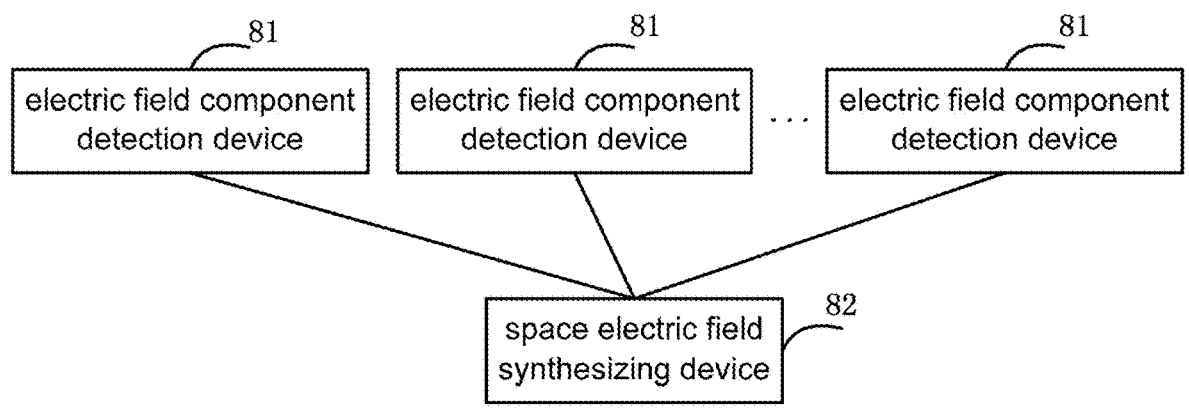
FIG. 8 is a schematic diagram of a space electric field detection system according to some embodiments of the present disclosure.

FIG. 8 is a schematic diagram of a space electric field detection system according to some embodiments of the present disclosure. As shown in FIG. 8, the space electric field detection system includes one or more electric field component detection devices 81 and a space electric field synthesizing device 82. The electric field component detection device 81 is an electric field component detection device according to any one of the embodiments shown in FIG. 1 to FIG. 7. The space electric field synthesizing device 82 electrically connected to the electric field component detection devices 81 determines the magnitude of the space electric field based on the detection results of the electric field component detection devices 81.

It should be noted that, since each electric field component detection device can detect the electric field component in one direction, the space electric field detection system can detect an electric field component in a certain direction, an electric field component in a certain plane or an electric field component in three-dimensional space according to the setting of each electric field component detection device.

In some embodiments, all the electric field component detection devices in the space electric field detection system detect electric field components in a specified direction. The specified direction may be any preset direction.

In some embodiments, all the electric field component detection devices detect the electric field components in the Y direction. The space electric field synthesizing device 82 calculates the average of the detection results obtained by the electric field component detection devices as the detection result of electric field component of the space electric field detection system in the Y direction.

Of course, the space electric field detection system can also detect the electric field components in the X direction or the Z direction according to the settings of all the electric field component detection devices.

In some embodiments, the space electric field detection system includes at least two electric field component detection devices. The electric field component detection devices are divided into a first group of electric field component detection devices and a second group of electric field component detection devices, each group including at least one electric field component detection device. The first group of electric field component detection devices is used for detecting electric field component in a first direction of the space electric field, and the second group of electric field component detection devices is used for detecting electric field component in a second direction of the space electric field, the first direction being perpendicular to the second direction. In this case, the space electric field synthesizing means 82 can synthesize the detection results obtained by each electric field component detection device, as the electric field component detection results of the space electric field detection system in the planes determined by the first direction and the second direction.

In some embodiments, the space electric field detection system includes two electric field component detection devices for detecting the electric field components in the X direction and the Y direction in the space electric field, respectively, so the space electric field synthesizing device 82 may use the formula, $$E_{XY}=\sqrt{E_X^2+E_Y^2}$$

to obtain the electric field component $E_{XY}$ in the XY plane, wherein $E_X$ is a measurement result of electric field component of one electric field component detection device in the X direction, and $E_Y$ is a measurement result of electric field component of another electric field component detection device in the Y direction.

Of course, the electric field components on the XZ plane and the YZ plane can also be detected according to the settings of the every electric field component detection device in the space electric field detection system.

In some embodiments, the space electric field detection system includes at least three electric field component detection devices. The electric field component detection devices are divided into a first group of electric field component detection devices, a second group of electric field component detection devices and a third group of electric field component detection devices, each group including at least one electric field component detection device. The first group of electric field component detection devices is used for detecting electric field component in a first direction of the space electric field, the second group of electric field component detection devices is used for detecting electric field component in a second direction of the space electric field, and the third group of electric field component detection devices is used for detecting electric field component in a third direction of the space electric field. The first direction, the second direction and the third direction being perpendicular to each other. In this case, the space electric field synthesizing means 82 can synthesize the detection results obtained by each electric field component detection device, as the detection result of the space electric field detection system in the three-dimensional space.

Figure 9:
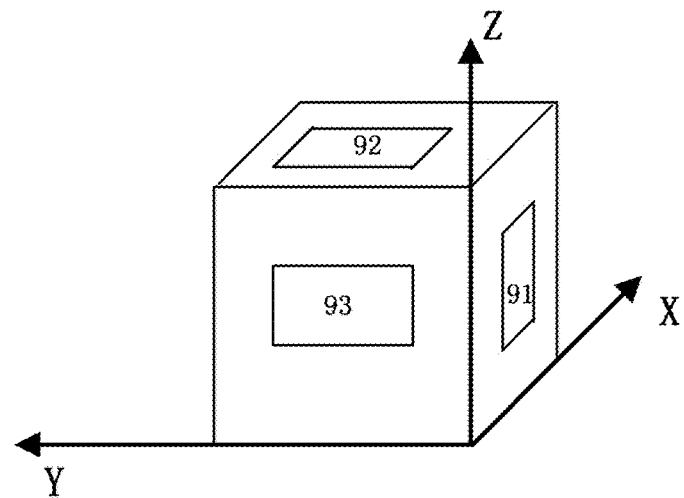
FIG. 9 is a schematic diagram of a space electric field detection system according to some other embodiments of the present disclosure.

In some embodiments, as shown in FIG. 9, the space electric field detection system includes three electric field component detection devices, wherein the electric field component detection device 91 is configured to detect the electric field component in the X direction in the space electric field, the electric field component detection device 92 is configured to detect the electric field component in the Y direction in the space electric field, and the electric field component detection device 93 is configured to detect the electric field component in the Z direction in the space electric field. Thus, the space electric field synthesizing device 82 may use the formula, $$E_{XYZ}=\sqrt{E_X^2+E_Y^2+E_Z^2}$$

to obtain the electric field component $E_{XYZ}$ in the three-dimensional space, wherein $E_X$ is a measurement result of electric field component of the electric field component detection device 91 in the X direction, $E_Y$ is a measurement result of electric field component of the electric field component detection device 92 in the Y direction, and $E_Z$ is a measurement result of electric field component of the electric field component detection device 93 in the Z direction.

In some embodiments, the space electric field synthesizing device 82 may further correct the detection result of each electric field component detection device. For example, if $E_J$ is the detection result of the $J_{th}$ electric field component detection device, the detection result of the electric field component detection device may be corrected as:

$$V_J=K_J E_J+V_0$$

wherein $V_J$ is the result of the correction, $K_J$ is the corresponding multiplicative parameter, $V_0$ is the corresponding additive parameter. Through the above correction, the accuracy of measurement can be further improved.

In some embodiments, the space electric field synthesizing device concerned in the above embodiments may be implemented as a general purpose processor, a programmable logic controller (PLC), a digital signal processor (DSP), an application specific integrated circuit (ASIC), a field programmable gate array (FPGA) or other programmable logic devices, discrete gates or transistor logics, discrete hardware components or any suitable combination thereof for performing the function described in the present disclosure.

Figure 10:
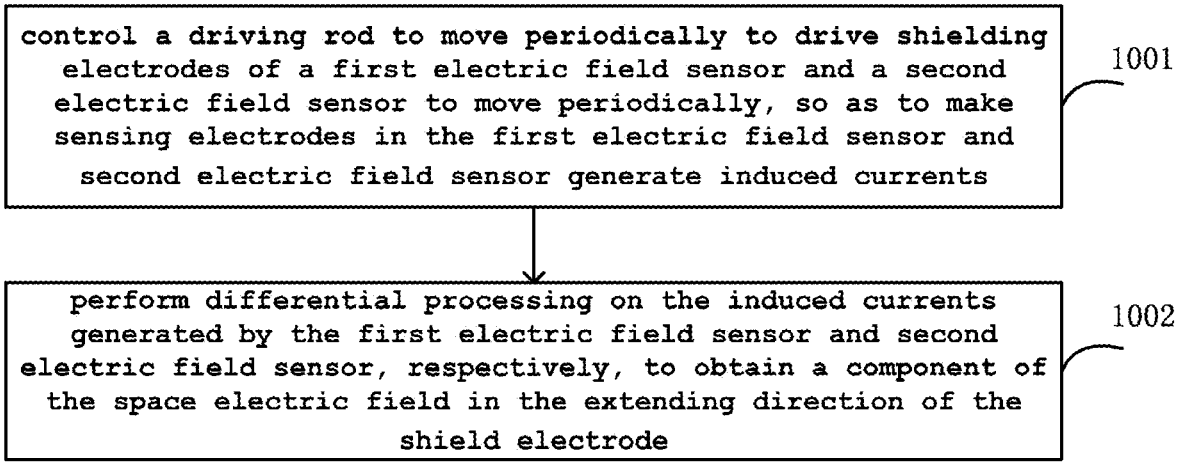
FIG. 10 is a flow chart of an electric field component detection method according to some embodiments of the present disclosure.

FIG. 10 is a flow chart of an electric field component detection method according to some embodiments of the present disclosure.

In step 1001, the driving rod is controlled to perform periodic movement, so as to drive the shielding electrodes of the first electric field sensor and the second electric field sensor to move periodically in the extending direction of the driving rod.

In some embodiments, as shown in FIGS. 1, 2a and 2b, the first electric field sensor 12 and the second electric field sensor 13 are disposed symmetrically with respect to the driving rod 11. In the first electric field sensor 12, the shielding electrode 121 is grounded and arranged vertically on the driving rod 11, and the sensing electrode 122 is arranged in parallel with the shielding electrode 121. In the second electric field sensor 13, the shielding electrode 131 is grounded and arranged vertically on the driving rod 11, and the sensing electrode 132 is arranged in parallel with the shielding electrode 131. During periodic movement of the shielding electrode 121 and the shielding electrode 131, induced charges changed periodically are generated in the sensing electrode 122 of the first electric field sensor 12 and the sensing electrode 132 of the second electric field sensor 13, thereby induced currents are produced. In addition, the elastic portions disposed on the two ends of the driving rod provide cushion protection for the driving rod.

In step 1002, differential processing is performed on induced currents generated by the first electric field sensor and the second electric field sensor, respectively, to obtain a component of the space electric field in an extending direction of the shielding electrode.

In some embodiments, the direction of the induced current is in the extending direction of the shielding electrode.

As shown in FIGS. 1, 2a and 2b, during the measurement of the electric field component in a certain direction (such as the Y direction), for the sensing electrode 122 of the first electric field sensor 12, suppose the induced charges in the X direction are Q1x, the induced charges in the Y direction are Q1y, and the induced charges in the Z direction are Q1z. For the sensing electrode 132 of the second electric field sensor 13, suppose the induced charges in the X direction are Q2x, the induced charges in the Y direction are Q2y, and the induced charges in the Z direction are Q2z. Since the first electric field sensor 12 and the second electric field sensor 13 are disposed symmetrically, $Q1z=Q2z$, $Q1x=Q2x$. Thus, differential processing is performed on the induced current to obtain output current $I_{output}$.

$$I_{output} = d(Q1x + Q1y + Q1z - Q2x - Q2y - Q2z)/dt$$

$$= d(Q1y - Q2y)/dt$$

Namely, the electric field component in the Y direction is obtained by using $Q1y$ and $Q2y$, and the interference of the components in the X direction and the Z direction of the electric field can also be eliminated effectively.

By implementing the solution of the present disclosure, at least one of the following beneficial effects can be obtained:

The first electric field sensor and the second electric field sensor are arranged symmetrically with respect to the driving rod in the electric field component detection device. During measurement of the electric field component in a specified direction, the interference of the components in other directions of the space electric field can be eliminated effectively by using the symmetrical structure of the first electric field sensor and the second electric field sensor.

The elastic portions are provided in the support members at both ends of the driving rod. A cushion protection is provided for the driving rod by the elastic portions during the periodic movement of the driving rod to avoid rupture of the driving rod.

Up to this point, the embodiments of the present disclosure have been described in detail. In order to avoid obscuring the concepts of the present disclosure, some details known in the art are not described. The person skilled in the art can totally understand how to implement the technical solution disclosed here according to the above description.

Although some specified embodiments of the present disclosure have been explained in detail by the examples, the person skilled in the art shall understand that the above examples are only intended for making explanation rather than for limiting the scope of the present disclosure. The person skilled in the art shall understand that the above embodiments can be amended or equivalent substitution of part of the technical features can be performed without deviating from the scope and spirit of the present disclosure. The scope of the present disclosure is defined by the following claims.

What is claimed is:

1. An electric field component detection device comprising:
   a first electric field sensor and a second electric field sensor arranged symmetrically with respect to a driving rod, wherein in each electric field sensor, a shielding electrode is grounded and arranged vertically on the driving rod, the shielding electrode being configured to be driven by the driving rod to move periodically in an extending direction of the driving rod, and a sensing electrode is arranged in parallel with the shielding electrode;
   a differentiator, electrically connected to the sensing electrode of the first electric field sensor and the sensing electrode of the second electric field sensor, respectively, and configured to perform differential processing on induced currents generated by the first electric field sensor and the second electric field sensor, respectively, to obtain a component of a space electric field in an extending direction of the shielding electrode;
   a first support member and a second support member, disposed at two ends of the driving rod, respectively, wherein each support member includes a bracket and an elastic portion disposed on the bracket, one end of the driving rod is connected with the elastic portion of the first support member, and the other end of the driving rod is connected with the elastic portion of the second support member.

2. The electric field component detection device according to claim 1, wherein:
   a direction of the induced currents is in the extending direction of the shielding electrode.

3. The electric field component detection device according to claim 1, further comprising:
   a support plate, configured to support the first support member, the second support member, and the sensing electrodes of the first electric field sensor and the second electric field sensor.

4. The electric field component detection device according to claim 1, wherein:
   the elastic portions are configured to extend and retract in the extending direction of the driving rod.

5. The electric field component detection device according to claim 1, further comprising:
   a drive mechanism in drive connection with the driving rod, configured to drive the driving rod to move periodically.

6. The electric field component detection device according to claim 5, wherein:
   the drive mechanism is an electrostatic comb drive.

7. A space electric field detection system comprising:
   at least one electric field component detection device, each of said at least one electric field component detection device comprising:
   a first electric field sensor and a second electric field sensor arranged symmetrically with respect to a driving rod, wherein in each electric field sensor, a shielding electrode is grounded and arranged vertically on the driving rod, the shielding electrode being configured to be driven by the driving rod to move periodically in an extending direction of the driving rod, and a sensing electrode is arranged in parallel with the shielding electrode;
   a differentiator, electrically connected to the sensing electrode of the first electric field sensor and the sensing electrode of the second electric field sensor, respectively, and configured to perform differential processing on induced currents generated by the first electric field sensor and the second electric field sensor, respectively, to obtain a component of a space electric field in an extending direction of the shielding electrode;
   a first support member and a second support member, disposed at two ends of the driving rod, respectively, wherein each of the first support member and the second support member includes a bracket and an elastic portion disposed on the bracket, one end of the driving rod is connected with the elastic portion of the first support member, and the other end of the driving rod is connected with the elastic portion of the second support member; and
   a space electric field synthesizing device, electrically connected to said at least one electric field component detection device, and configured to determine a magnitude of the space electric field based on a detection result of said at least one electric field component detection device.

8. The space electric field detection system according to claim 7, wherein:
the space electric field synthesizing device is further configured to correct the detection result of each of said at least one electric field component detection device.

9. The space electric field detection system according to claim 8, wherein:
the space electric field synthesizing device is further configured to correct the detection result of each of said at least one electric field component detection device by using corresponding multiplicative parameter(s) and additive parameter(s).

10. The space electric field detection system according to claim 7, wherein:
each of the at least one electric field component detection device is configured to determine an electric field component in a specified direction of the space electric field.

11. The space electric field detection system according to claim 7, wherein the at least one electric field component detection device is divided into a first group of electric field component detection devices and a second group of electric field component detection devices, each group including at least one electric field component detection device, wherein:
the first group of electric field component detection devices is configured to detect electric field component in a first direction of the space electric field, and the second group of electric field component detection devices is configured to detect electric field component in a second direction of the space electric field, wherein the first direction and the second direction are perpendicular to each other.

12. The space electric field detection system according to claim 7, wherein the at least one electric field component detection device is divided into a first group of electric field component detection devices, a second group of electric field component detection devices and a third group of electric field component detection devices, each group including at least one electric field component detection device, wherein:
the first group of electric field component detection devices is configured to detect electric field component in a first direction of the space electric field, the second group of electric field component detection devices is configured to detect electric field component in a second direction of the space electric field, and the third group of electric field component detection devices is configured to detect electric field component in a third direction of the space electric field, wherein the first direction, the second direction and the third direction are perpendicular to each other.

13. The space electric field detection system according to claim 7, wherein:
a direction of the induced currents is in the extending direction of the shielding electrode.

14. The space electric field detection system according to claim 7, each of the at least one electric field component detection device further comprising:
a support plate, configured to support the first support member, the second support member, and the sensing electrodes of the first electric field sensor and the second electric field sensor.

15. The space electric field detection system according to claim 7, wherein:
the elastic portion of the first support member and the elastic portion of the second support member are configured to extend and retract in the extending direction of the driving rod.

16. The space electric field detection system according to claim 7, wherein the at least one electric field component detection device further comprises:
a drive mechanism in drive connection with the driving rod, configured to drive the driving rod to move periodically.

17. The space electric field detection system according to claim 16, wherein:
the drive mechanism is an electrostatic comb drive.

18. An electric field component detection method comprising:
controlling a driving rod to move periodically, so as to drive shielding electrodes of a first electric field sensor and a second electric field sensor to move periodically in an extending direction of a driving rod, wherein the first electric field sensor and the second electric field sensor are arranged symmetrically with respect to the driving rod, in each electric field sensor, the respective shielding electrode is grounded and arranged vertically on the driving rod, a sensing electrode is arranged in parallel with the respective shielding electrode, and elastic portions disposed on two ends of the driving rod provide elastic protection to the driving rod;
performing differential processing on induced currents generated by the first electric field sensor and the second electric field sensor, respectively, to obtain a component of a space electric field in an extending direction of the shielding electrodes of the first electric field sensor and the second electric field sensor.

19. The electric field component detection method according to claim 18, wherein:
a direction of the induced currents is in the extending direction of the shielding electrodes of the first electric field sensor and the second electric field sensor.

20. The electric field component detection method according to claim 18, wherein:
the elastic portions are configured to extend and retract in the extending direction of the driving rod.

* * * * *